(12) United States Patent
Marutani

(10) Patent No.: US 10,734,561 B2
(45) Date of Patent: Aug. 4, 2020

(54) METHOD OF MANUFACTURING WIRING BOARD, WIRING BOARD, AND LIGHT EMITTING DEVICE USING THE WIRING BOARD

(71) Applicant: NICHIA CORPORATION, Anan-shi (JP)

(72) Inventor: Yukitoshi Marutani, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/599,555

(22) Filed: May 19, 2017

(65) Prior Publication Data

US 2017/0338392 A1    Nov. 23, 2017

(30) Foreign Application Priority Data

May 20, 2016    (JP) ................. 2016-101764

(51) Int. Cl.

| | | |
|---|---|---|
| *H01L 33/64* | (2010.01) | |
| *H01L 25/075* | (2006.01) | |
| *H05K 1/18* | (2006.01) | |
| *H05K 3/10* | (2006.01) | |
| *H05K 1/11* | (2006.01) | |
| *H01L 33/62* | (2010.01) | |
| *H05K 3/20* | (2006.01) | |

(52) U.S. Cl.
CPC ............ *H01L 33/647* (2013.01); *H05K 1/119* (2013.01); *H05K 1/181* (2013.01); *H05K 3/10* (2013.01); *H01L 25/0753* (2013.01); *H01L 33/62* (2013.01); *H05K 3/20* (2013.01); *H05K 2201/09972* (2013.01); *H05K 2201/10106* (2013.01); *Y02P 70/611* (2015.11)

(58) Field of Classification Search
CPC ..... H01L 33/56; H01L 33/483; H01L 33/486; H01L 33/647; H01L 33/62; H01L 25/0753; H01L 33/44; H01L 33/46
See application file for complete search history.

(56) References Cited

U.S. PATENT DOCUMENTS

| | | |
|---|---|---|
| 2002/0132450 A1 | 9/2002 | Nose |
| 2003/0135998 A1 | 7/2003 | Walz et al. |
| 2008/0145567 A1 | 6/2008 | Ohmae et al. |
| 2009/0133804 A1 | 5/2009 | Kanematsu et al. |
| 2011/0104858 A1* | 5/2011 | Katagiri ............. H01L 24/97 438/121 |
| 2011/0133232 A1 | 6/2011 | Yoshioka et al. |

(Continued)

FOREIGN PATENT DOCUMENTS

| | | |
|---|---|---|
| JP | 6-302864 | 10/1994 |
| JP | 10-193020 | 7/1998 |

(Continued)

*Primary Examiner* — Thanh Y. Tran
(74) *Attorney, Agent, or Firm* — Mori & Ward, LLP

(57) ABSTRACT

A method of manufacturing a wiring board includes: providing an insulating member that includes a plurality of regions partitioned by partitions provided with openings at each of which adjacent ones of the regions are joined to each other; disposing conductive members respectively in the plurality of regions; and joining adjacent ones of the conductive members through one of the partitions to each other at the opening of the partition.

8 Claims, 13 Drawing Sheets

(56) References Cited

U.S. PATENT DOCUMENTS

2013/0181236 A1* 7/2013 Tamaki .................. H01L 33/56
                                                              257/88
2016/0343927 A1* 11/2016 Yuasa ..................... H01L 24/05
2017/0358725 A1* 12/2017 Marutani ................ H01L 33/62

FOREIGN PATENT DOCUMENTS

| JP | 2002-270711 | 9/2002 |
|----|-------------|--------|
| JP | 2002-270724 | 9/2002 |
| JP | 2002-270725 | 9/2002 |
| JP | 2002-270726 | 9/2002 |
| JP | 2002-314245 | 10/2002 |
| JP | 2003-519442 | 6/2003 |
| JP | 2007-27157 | 2/2007 |
| JP | 2007-098930 | 4/2007 |
| JP | 2007-227737 | 8/2007 |
| JP | 2008-235469 | 9/2007 |
| JP | 2007-214162 | 10/2007 |
| JP | 2007-273602 | 10/2007 |
| JP | 2007-273603 | 10/2007 |
| JP | 2008-147242 | 6/2008 |
| JP | 2010-083079 | 4/2010 |
| JP | 2010-125637 | 6/2010 |
| JP | 2010-135718 | 6/2010 |
| JP | 2010-186022 | 8/2010 |
| JP | 2013-014134 | 1/2013 |
| JP | 2014-087816 | 5/2014 |
| JP | 2015-111620 | 6/2015 |
| JP | 2016-004770 | 1/2016 |

* cited by examiner

——— slit
——— mountain fold line
--------- valley fold line

METHOD OF MANUFACTURING WIRING BOARD, WIRING BOARD, AND LIGHT EMITTING DEVICE USING THE WIRING BOARD

CROSS-REFERENCE TO RELATED APPLICATION

This application claims priority to Japanese Patent Application No. 2016-101764, filed on May 20, 2016, the disclosure of which is hereby incorporated by reference in its entirety.

BACKGROUND

Field of the Invention

The present disclosure relates to a method of manufacturing a wiring board, a wiring board, and a light emitting device using the wiring board.

Discussion of the Background

For printed wiring boards (PWBs) used for LED illumination or the like, known mounting boards can be used such as an aluminum-based single-sided board, a CEM-3 copper clad board. For example, Japanese Unexamined Patent Application Publication No. 2016-4770 discloses a method of manufacturing a light source mounting wiring board in which a wiring pattern is formed by partially removing layered copper foil by etching.

However, such a conventional PWB using copper foil is less likely to spread heat generated by a semiconductor element which consumes great power, such as a light emitting diode, over the copper foil. As a result, the temperature of the semiconductor element is increased, thereby degrading the performance thereof. In manufacturing a PWB using copper foil, since a wiring pattern is formed by etching, resist waste liquid, etching waste liquid or other liquid is generated during the manufacture. Further, forming the wiring pattern by wet plating generates plating waste liquid. Treatments of such waste liquids lead to increased costs of conventional PWBs.

The present embodiment has been made in view of the circumstance, and an object of the present disclosure is to provide: a less costly method of manufacturing a wiring board for mounting a semiconductor element that consumes great power such as a light emitting element; a light emitting element mounting wiring board with improved heat dissipation property; and a light emitting device using the wiring board.

SUMMARY

A method of manufacturing a wiring board according to one embodiment of the present disclosure includes: providing an insulating member that includes a plurality of regions partitioned by partitions provided with openings at each of which adjacent ones of the regions are joined to each other; disposing conductive members respectively in the plurality of regions; and joining adjacent ones of the conductive members through one of the partitions to each other at the opening of the partition.

Further, a wiring board according to one embodiment of the present disclosure includes: partitions each having insulating property; and conductive members that are respectively disposed in at least two adjacent regions among a plurality of regions partitioned by the partitions. Two of the conductive members respectively disposed in the adjacent regions are joined to each other through an opening formed on one of the partitions interposed between the two of the conductive members, to serve as part of a wiring.

This can provide a method of manufacturing a wiring board for mounting a semiconductor element that consumes great power such as a light emitting element, while reduced costs of waste liquid treatment and the like, in manufacture of the wiring board; a light emitting element mounting wiring board with improved heat dissipation property; and a light emitting device using the wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1:
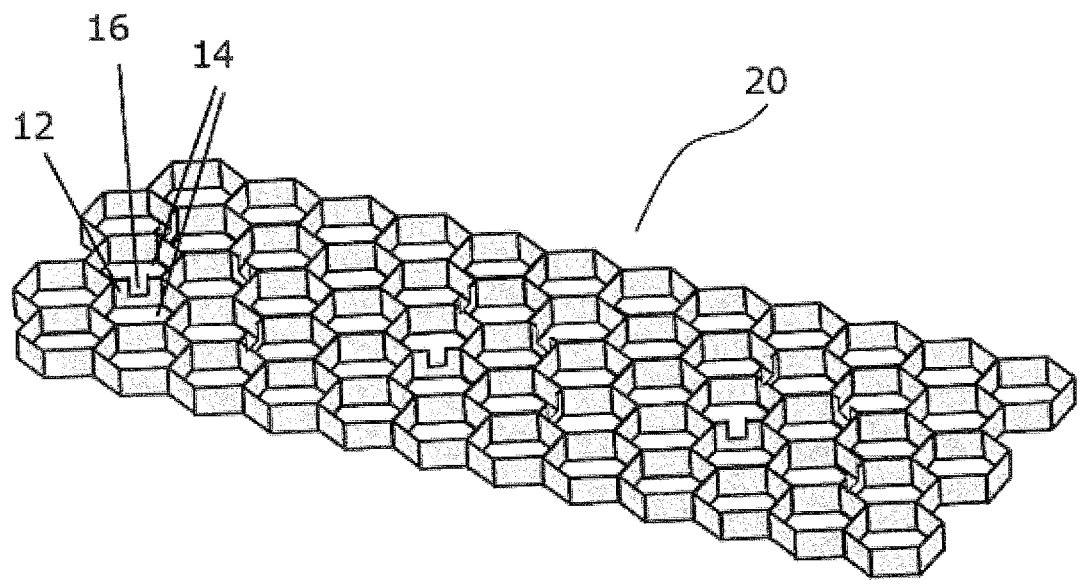
FIG. 1 is a schematic diagram of a honeycomb structure as an insulating member according to a first embodiment of the present invention.

In the following, a description will be given of embodiments of the disclosure with reference to the drawings as appropriate. A method of manufacturing a wiring board, a wiring board, and a light emitting device using the wiring board described in the following are for embodying the technical idea of the present disclosure. Unless otherwise specified, the present disclosure is not specified to the following. Further, the description provided in one embodiment or example is applicable to other embodiment or example. In the description of the structure of other embodiment, identical or similar members are denoted by identical names, and their detailed descriptions are omitted as appropriate. The size or positional relationship of the members in the drawings may be exaggerated for the sake of clarity.

In the following, a description will be given of a method of manufacturing a light emitting element mounting wiring board according to embodiments of the present disclosure with reference to the drawings as appropriate.

First Embodiment

A method of manufacturing a wiring board according to one embodiment of the present disclosure includes: providing an insulating member 20 that includes a plurality of regions 14 partitioned by partitions 12 provided with openings 16 at each of which adjacent ones of the regions 14 are joined to each other; disposing conductive members 17 respectively in the plurality of regions 14; and joining adjacent ones of the conductive members 17 through one of the partitions 12 to each other at the opening of the partition.

Providing Insulating Member

In the manufacturing method according to the present embodiment, the insulating member 20 that has the plurality of regions 14 partitioned by the partitions 12 is provided in providing an insulating member as shown in FIG. 1. The plurality of regions 14 include at least a portion where adjacent regions 14 are connected to each other at the opening 16 of any of the partitions 12, and at least a portion where regions 14 are partitioned by the partitions 12 with no openings 16. The shape of one of the regions formed by the partitions 12 as seen in a top view may be hexagonal as shown in FIG. 1. Alternatively, the shape may be triangular, quadrangular, or octagonal, which can be understood from the fact that the shape of the honeycomb structure shown in FIG. 1 as seen in a top view becomes rectangular when the honeycomb structure is pulled in the longitudinal direction and each hexagonal shape becomes a rectangular shape.

The wiring board is heated in a reflow oven or the like in mounting semiconductor elements or the like. Accordingly, the insulating member 20 is preferably heat-resistant. Further, the insulating member 20 is flame-retardant, having flame-retardant property of about V-0 or VTM-0 in the Flammability Standard UL 94. For example, the insulating member 20 may be formed of an insulating resin film (also referred to as an insulating resin coat or an insulating resin sheet, and for example, specifically, polyimide film, polyamide-imide film), a ceramic green sheet applicable for LTCC or the like. The partitions 12 may have a thickness in the range of, for example, 10 μm to 200 μm, preferably 10 μm to 100 μm.

The insulating member may be, for example, the honeycomb core disclosed in Japanese Unexamined Patent Application Publication No. 2014-87816, or the honeycomb structure disclosed in Japanese Unexamined Patent Application Publication No. 2007-98930. The partitions being arranged to form a honeycomb structure can achieve a reduction in weight while reliably obtaining strength. In the case where the honeycomb core disclosed in the Patent Publication No. 2014-87816 is used, the surface of the insulating member 20 may be adhesive for improving manufacturability of the honeycomb structure.

Each opening 16 is formed by partially removing one partition 12. The opening 16 may be formed by removing the entire partition that partitions adjacent regions. Alternatively, for example as shown in FIG. 1, the opening 16 may be formed by removing a portion of one partition that partitions adjacent regions. In order to maintain the strength of the insulating member, one partition 12 is preferably continuous at its upper portion, its lower portion, or its middle portion. In FIG. 1, one partition 12 is continuous at its lower portion in the insulating member 20. Just predetermined regions are each provided with the opening at their upper portions. It is also possible that the upper portion and the lower portion of one partition 12 are continuous and, for example, an angular (or circular) through hole is provided at the middle portion of the partition 12 as the opening. Alternatively, one partition 12 may be continuous at its middle portion and provided with an opening at each of its upper portion and its lower portion.

Figure 2:
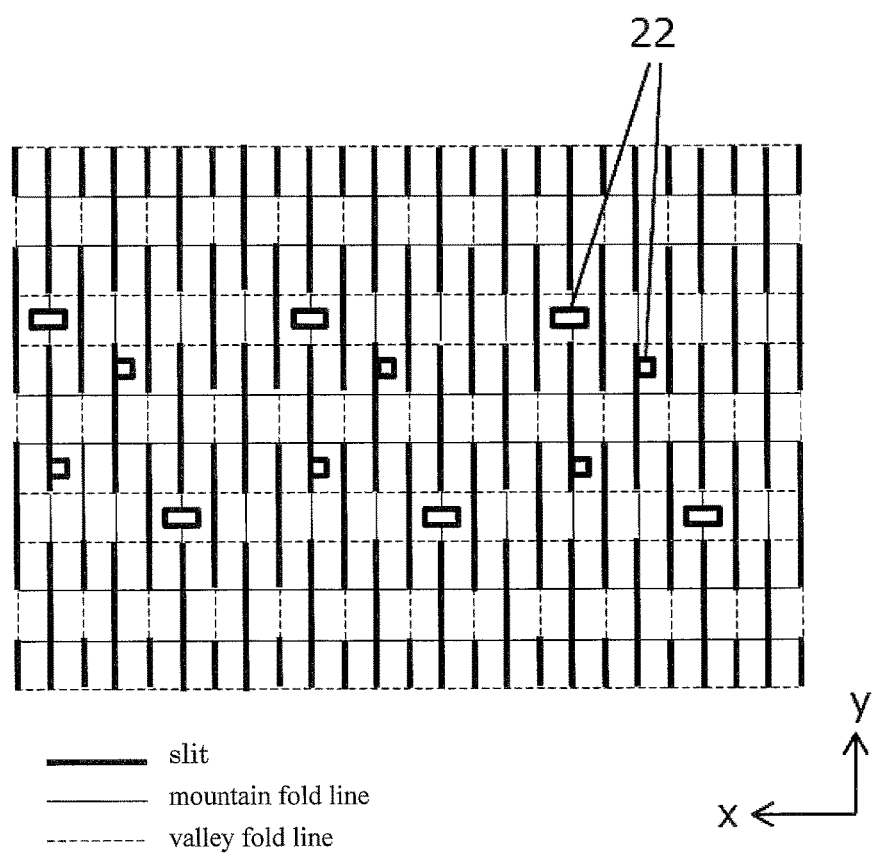
FIG. 2 is a schematic diagram showing the honeycomb structure being the insulating member, before being folded, according to the first embodiment of the present invention.

FIG. 2 is a diagram showing an exemplary insulating film used for forming the honeycomb structure shown in FIG. 1. The bold lines represent slits, the narrow lines represent mountain fold lines, and the broken lines represent valley fold lines. As shown in FIG. 2, the mountain fold lines and the valley fold lines are alternately provided on the insulating film in x direction with a predetermined cycle along y direction which is perpendicular to x direction, and the slits are provided at predetermined positions of the mountain fold lines and the valley fold lines. Further, through holes 22 are provided so as to be in contact with (or so as to intersect) predetermined positions of the mountain fold lines and the valley fold lines. Two mountain fold lines and two valley fold lines are alternately provided in a predetermined cycle in parallel to x direction. The repetitive two mountain fold lines and two valley fold lines are folded at 120°, and folded back at the mountain fold lines and valley fold lines being perpendicular to x direction (i.e., folded at 180°). Thus, the honeycomb structure shown in FIG. 1 is faulted. The insulating member may be formed by suitable method other than such a film folding method. For example, the insulating member may be formed by joining a mountain area and a valley area of a wavy insulating film to each other and layering the same (Japanese Patent Publication No. 2010-83079, Japanese Patent Publication No. 2010-125637), or by extrusion molding using a mold (Japanese Patent Publication No. 2013-14134).

Disposing Conductive Members

Figure 3:
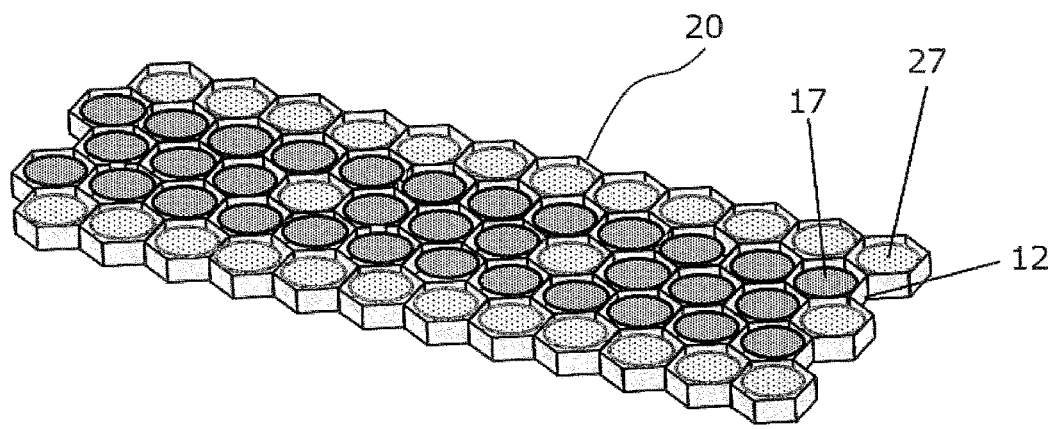
FIG. 3 is a schematic diagram showing the honeycomb structure being the insulating member according to the first embodiment of the present invention, in which conductive members and spacer members are disposed.

After the providing the insulating member, as shown in FIG. 3, the at least one conductive member 17 is each disposed in the regions 14 to be wiring paths. Further, in order to obtain a lightweight wiring board, at least one spacer member 27 may be each disposed in the regions 14 where conductive members 17 are not disposed.

The shape of each conductive member 17 may be spherical, prism-like, tubular, or the like. For example, in the case where a wiring board that has through holes for mounting components having leads is manufactured, a tubular conductive member is disposed in a predetermined position. The term "components having leads" as used herein may refer axial components or radial components having leads that are inserted into the board or sockets, specifically, a bullet LED, a can package, a DIP, or the like. In the case of the conductive member 17, for example, spherical, the conductive member 17 may have a diameter in the range of 0.4 mm to 5 mm. The conductive member 17 must have good electrical conductivity and good thermal conductivity, and specifically made of a material including copper, silver, aluminum, tin, gold, platinum, various kinds of solder and the like. In the case where high thermal conductivity is required, the conductive member 17 is formed of a uniform material; in the case where high thermal conductivity is not required, the conductive member 17 may not be formed of a uniform material, and may have a layered structure, or may be an aggregated small particles of conductive members, such as a crumb structure. In the case where the conductive member 17 has a layered structure, preferably the outer layer is made of a material being highly electrically conductive, while the inner layer is made of a lightweight material regardless of electrical conductivity (e.g., aluminum, resin), or voids, in view of reducing weight of the wiring board. The outer surface of the conductive member 17 is preferably smooth so that the area of the outer surface is reduced, which contributes to reducing formation of conductivity inhibiting substances such as oxides, and consequently contributes to establishing electrical connection. The outer surface may be plated for discouraging formation of conductivity inhibiting substances such as oxides. The surface of the conductive member 17 serving as part of the upper surface of the wiring board is preferably highly light-reflective to light emitted by the mounted light emitting element to improve light extraction efficiency. Being high in solderability, the conductive member 17 can establish good electrical connection with the light emitting element.

The conductive member at a position where a semiconductor element that generates a large amount of heat, such as a semiconductor light emitting element, is mounted, and the surrounding conductive members are preferably entirely formed of a member that is highly thermally conductive. At a position where the heat dissipation property is not essential, the conductive member may be used, for example, a lightweight member of which surface is equipped with a conductive film by plating or the like, such as a metal-plated resin ball, for the purpose of reducing weight of the wiring board while reliably obtaining electrical conductivity.

The spacer members 27 are members that structure the wiring board, and disposed in regions 14 excluding the regions 14 where the conductive members 17 used to energize wirings are disposed. Since the spacer members 27 are not intended to be energized, the spacer members 27 may be insulating or conductive. The spacer members 27 preferably have good bondability with the insulating member and have predetermined mechanical strength, in order to ensure the mechanical strength of the wiring board. The spacer members 27 are preferably smaller in density than the conductive members 17 (that is, being lightweight), in such a manner as to contribute toward reducing the weight of the wiring board. For example, the spacer members 27 may be made of thermosetting resin or thermoplastic resin. With the light emitting element mounting wiring board, preferably the spacer members 27 near the light emitting element mounting areas are made of a material that is less likely to absorb light from the light emitting elements nor is less likely to deteriorate due to light and heat. For example, the spacer members 27 made of a resin material preferably contain filler or the like and capable of light blocking, and particularly are light-reflective. In the case where the semiconductor element (e.g., packaged LED or the like) mounted on the wiring board is equipped with a heat sink that is not energized and provided on the bottom surface, a spacer member 27 thermally connected to the heat sink and/or spacer members 27 adjacent to the spacer member 27 preferably has good thermal conductivity to dissipate heat from the semiconductor element.

Joining

Figure 4:
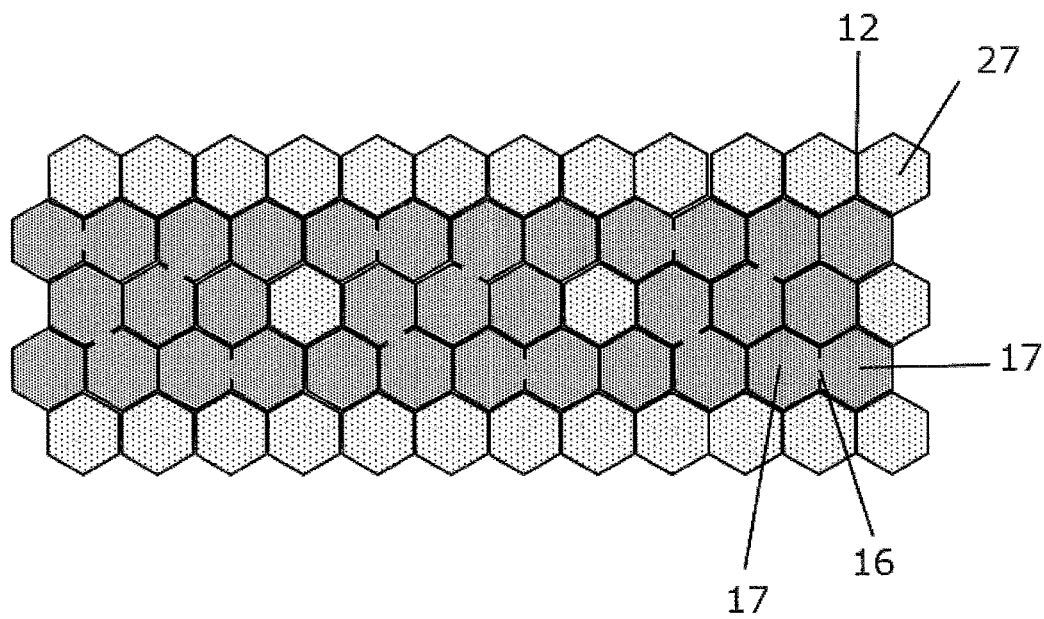
FIG. 4 is a schematic diagram of the honeycomb structure being the insulating member according to the first embodiment of the present invention, in which the conductive members and the spacer members are disposed and thereafter pressed, so that the conductive members and the spacer members fill the honeycomb structure without leaving empty.

In joining, conductive members 17 respectively disposed in adjacent regions 14 are electrically and mechanically joined to each other at one opening 16 provided on one partition 12 of the insulating member 20. The conductive members 17 can be joined to each other by any appropriate joining technique, such as compression joining, fusing, soldering, or bonding with a conductive adhesive agent. According to the joining technique, joining conditions can be selected as appropriate, such as pressurizing, heating, drying and the like. For example, a conductive joining material such as solder paste or silver paste may be disposed between the adjacent conductive members 17 including the opening, and thereafter the conductive members 17 and the joining member may be heated or dried so that the conductive members 17 are electrically connected to each other. Alternatively, each conductive member 17 may be deformed by being pressurized by a press machine from above and/or below, so that the conductive members 17 are brought into contact with the partitions 12, and so that adjacent conductive members 17 are connected to each other through the opening 16 under pressure. Additionally, after being joined to each other under pressure, the conductive members 17 may be heated so that the conductive members 17 are melted at their surfaces including nearby regions, and thereby fused to each other. By the conductive members 17 being joined to each other at the opening 16, as shown in FIG. 4, the conductive members 17 form part of the wiring of the wiring board.

According to the present embodiment, for example, since the conductive members 17 are joined to each other through the opening 16 of the insulating resin film, the area of the opening 16 that serves as the current path can readily be greater than the cross-sectional area of the conventional PWB wiring layer. Therefore, electrical resistance of the wiring board can be lower than that of the conventional PWB wiring. This is explained as follows. The conventional PWB wiring employs copper foil that has a thickness of about several tens of microns, which is a thin film, whereas the opening according to the present embodiment can be easily formed to be greater than that. Further, an increase in the volume also increases the mechanical strength of the wiring. In order to enhance the mechanical strength and the heat dissipation property of the wiring board, the respective spacer members 27 on the opposite sides of one partition 12 may be joined to each other through the opening provided to the partition 12.

The size of one opening 16 provided on partition 12 of the insulating member 20 may have, for example, a height of 1 mm, a width of 0.1 mm, and an area of 0.1 $mm^2$, or a height of 0.5 mm, a width of 2 mm, and an area of 1 $mm^2$. The wiring resistance is inversely proportional to the cross-sectional area of the wiring and proportional to the length of the wiring. In the present embodiment, since the cross-sectional area of the wiring is the smallest at the opening 16, the cross-sectional area of the opening 16 influences the wiring resistance. In the present embodiment, the area of the opening 16 can be easily increased to be greater than the cross-sectional area of the conventional PWB wiring made of copper foil. Accordingly, the present embodiment can reduce voltage drop or power consumption due to the wiring resistance when the current value is great in a circuit including a semiconductor element with great power consumption. An insulating resin film having a thickness in the range of 12 μm to 50 μm can provide the insulating property required for the partition 12. Accordingly, several tens of micrometers is sufficient as the thickness of the partition 12. The smaller thickness of the partition 12 is preferable for reducing the wiring resistance, with the partition 12 having a thickness up to about 100 μm, the conductive members 17 having dimension greater than that occupy most length of the wiring. Accordingly, the thickness of the partition 12 less influences the resistance value of the wiring.

Forming Metal Films

Figure 5:
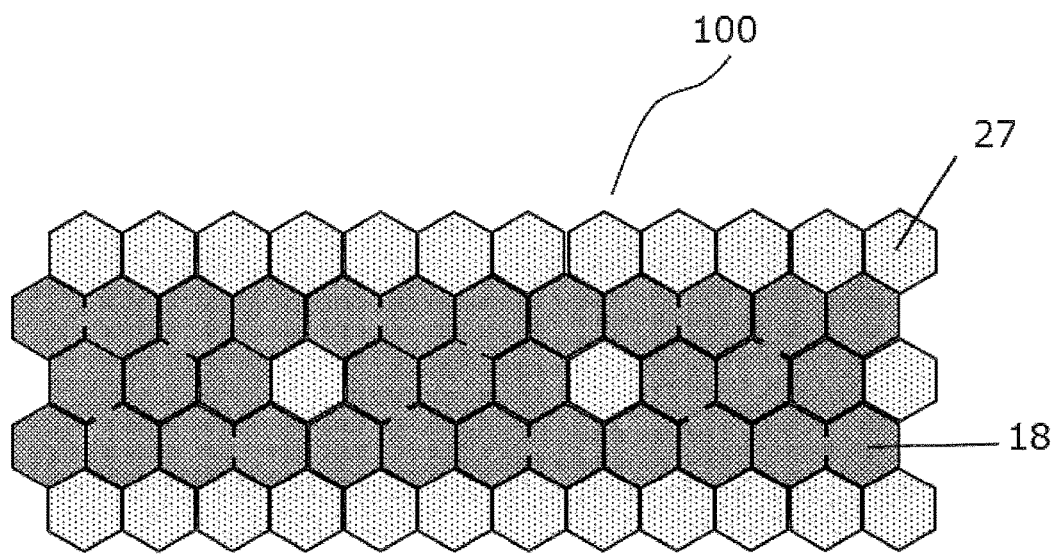
FIG. 5 is a schematic diagram of a wiring board according to the first embodiment of the present invention.

In order to improve the electrical connectivity or the light-reflectivity of the conductive members 17, metal films 18 shown in FIG. 5 may be formed on or above predetermined areas of the surface of the wiring board where the semiconductor elements are mounted (i.e., the upper surface) or the back surface (i.e., the lower surface) thereof, by plating, sputtering, or adhering metal foil.

The metal films 18 may each be a single-layer film, or a multilayer film. Since the metal films 18 are connected to the semiconductor elements or the outside of the light emitting device via connection terminals, connectors, or the like, the metal films are preferably made of a material being high in electrical conductivity and thermal conductivity, and in mechanical and/or electrical connectivity. Specifically, the metal films 18 preferably contain copper, silver, aluminum, tin, gold, platinum, various kinds of solder, or the like in the outermost film. Further, when employing light emitting elements as the semiconductor elements, the metal films are preferably made of a material being high in light-reflectivity (e.g., Ag or the like). The metal films 18 are not necessarily formed over all the conductive members 17. For example, the metal films 18 may be formed on or above any of the conductive members 17 where formation of the metal films 18 is required, such as the areas for mounting the semiconductor elements, the areas for mounting the external connection terminals, or any surrounding area of the foregoing. Forming the metal films 18 is an arbitrary step. Depending on the material or structure of the conductive members 17, the metal films 18 need not be fainted. Further, the metal films 18 having high light-reflectivity may be formed not only on the surface of the conductive members 17, but also on the surface of the spacer members 27. Thus, light from the light emitting elements is reflected also by the surface of the spacer members 27.

Forming Protective Film

Figure 6:
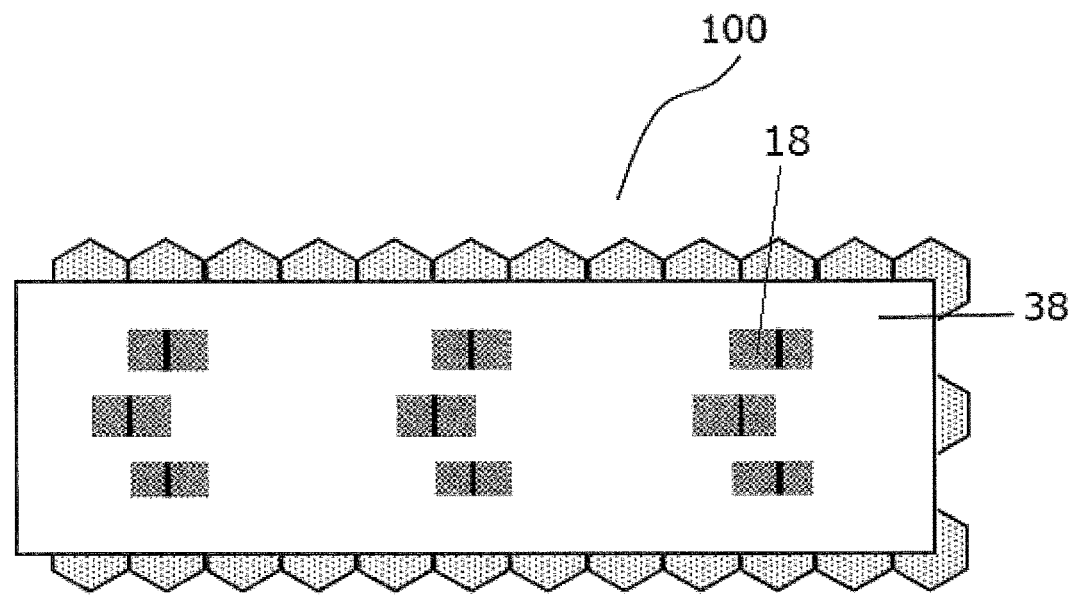
FIG. 6 is a schematic diagram of the wiring board according to the first embodiment of the present invention, on which a protective film is formed.

As shown in FIG. 6, an insulating protective film 38 is preferably formed by, for example, coating or adhering, on an area excluding predetermined ones of the metal films 18 and conductive members 17, which are to be connected to external connection terminals or on which semiconductor elements be mounted, in the surface of the wiring board where the semiconductor elements are to be mounted (i.e., the upper surface) and/or the back surface (i.e., the lower surface) thereof, in order to ensure an insulation distance (i.e., the creepage distance and the spatial distance) required for the wiring board.

The protective film may be a single-layer film or a multilayer film, and may be coating with varnish, solder resist, permanent resist, or the like, or may be a semi-cured material such as a film or a sheet as well. In the case where the protective film is provided on the back surface of the wiring board, and part of the conductive members are exposed at the back surface, the protective film may be photosensitive (formed of photosensitive film resist). As necessary, an insulating light-reflective film having light-reflectivity may be used for the protective film 38. With the light emitting element mounting wiring board, the upper surface of the wiring board preferably has higher light reflectivity with respect to emission light wavelength of the light emitting elements. For example, the upper surface of the wiring board is preferably set to exhibit a reflectivity of 70% or more of the light emitted by the light emitting elements mounted thereon. Further, preferably the protective film 38 has higher light reflectivity than the conductive members 17 are, with respect to the light emitted by the light emitting elements. Examples of the protective film 38 include B-stage epoxy resin containing white-color filler, white-color varnish, or a heat-resistant resin film containing white color filler (specifically, an aramid resin film, a polyamide-imide resin film, or the like) such as an adhesive layer-equipped white-color polyimide film. The protective film 38 also serving as an insulating light reflective film can be formed on a predetermined area of the surface of the wiring board where the semiconductor elements are mounted.

Mounting Semiconductor Elements

Figure 7:
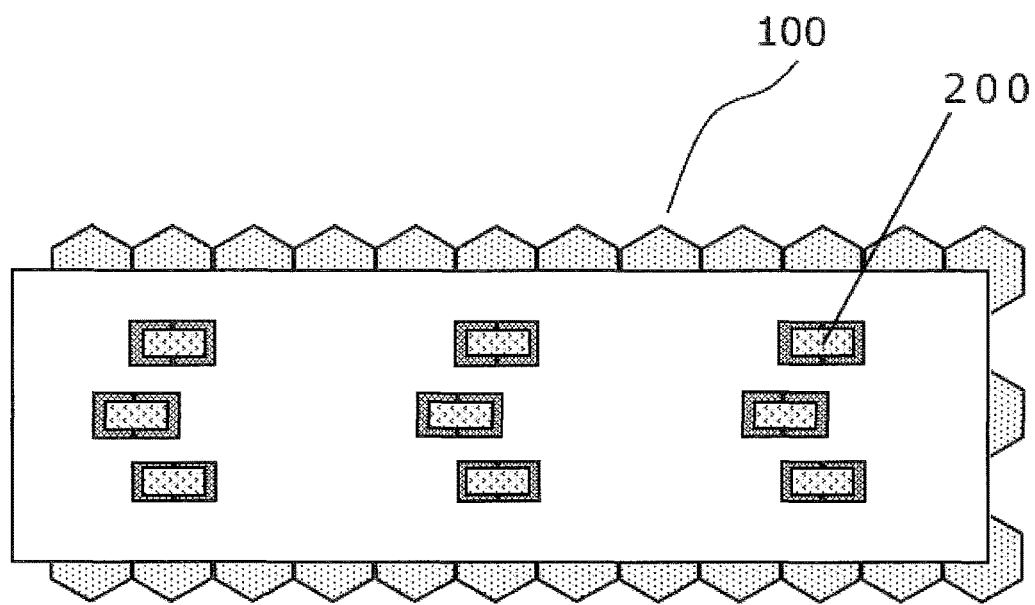
FIG. 7 is a schematic diagram showing the wiring board on each of which light emitting elements (LEDs) are mounted, according to the first embodiment of the present invention provided with resin frames.

On the wiring board formed through the foregoing steps, for example, one or more light emitting elements 200 are mounted as semiconductor elements. In the present embodiment, the surface-mount type light emitting elements 200 each having a pair of positive and negative electrodes on its one surface are mounted on the upper surface of the wiring board as shown in FIG. 7. At this time, a pair of conductive members 17 or at least one metal film 18 Ruined thereon is/are each electrically connected to the positive and negative electrode of one of the light emitting elements 200. For the conductive connection between the light emitting element mounting wiring board and the one or more light emitting elements, solder, anisotropic conductive paste, or the like may be used.

Examples of the light emitting elements 200 include semiconductor light emitting elements such as light emitting diodes, laser diodes, light emitting transistors or the like. The light emitting elements 200 may be packaged. Alternatively, each of light emitting elements 200 may be a light emitting diode chip that has electrodes on its one surface. In the case of light emitting diode chips, face-down mounted (junction-down mounted), or face-up mounted (junction-up mounted) may be employed.

Singulating

Figure 8:
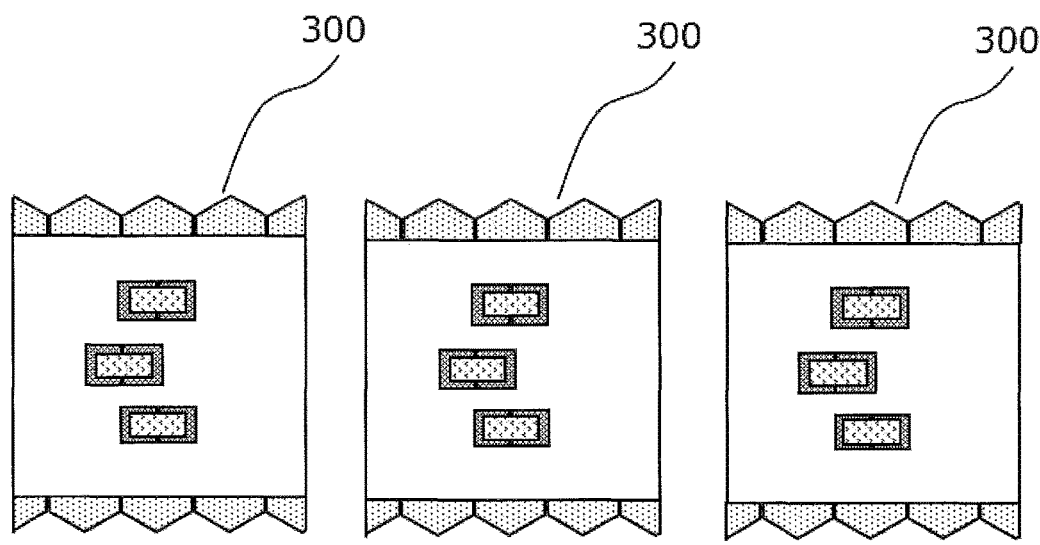
FIG. 8 is a schematic diagram of a light emitting device which is obtained by cutting the wiring board on each of which the light emitting elements (LEDs) are mounted, according to the first embodiment of the present invention provided with the resin frames.

The wiring board 100 on which the light emitting elements 200 are mounted is cut/divided along predetermined cutting lines, thereby singulated, to provide light emitting devices 300 as shown in FIG. 8. Disposing the spacer members 27 in a greater number or disposing just the spacer members 27 in the regions where the cutting/dividing lines pass improves productivity, because blades, which are for example used in a die for punching or in a dicer for cutting, wear slower than when the regions where the cutting/dividing lines pass is metal.

Further, for example, the insulating member can employ ceramic green sheet applicable for LTCC, and the spacer members 27 can employ a material that can be singulated by breaking, for example, glass epoxy. Therefore, the wiring board 100 may be divided and singulated by breaking. Also a reduction in wear of the cutting/dividing tools and an increase in the speed of cutting/dividing achieve high productivity. As described above, the method of manufacturing the wiring board according to the present embodiment does not employ etching nor wet plating in fanning the wiring pattern. Accordingly, resist waste liquid, etching waste liquid, and plating waste liquid are not produced in manufacture. This reduces the manufacturing costs of the wiring board.

Second Embodiment

A method of manufacturing a wiring board according to the present embodiment includes, similarly to the first embodiment: providing an insulating member; disposing conductive members; joining; forming metal films (FIG. 9); and forming at least one protective film (FIGS. 11, 12, and 13A and 13B). In the present embodiment, as shown in FIGS. 11 to 13B, excluding the semiconductor elements and the external terminal connecting portions, the surface of the wiring board is covered with an insulating protective film 37 or a protective film 38 having light reflectivity, and wiring function is provided by conductive members connected to each other at a corresponding opening not on the surface but the inside the wiring board.

Figure 10:
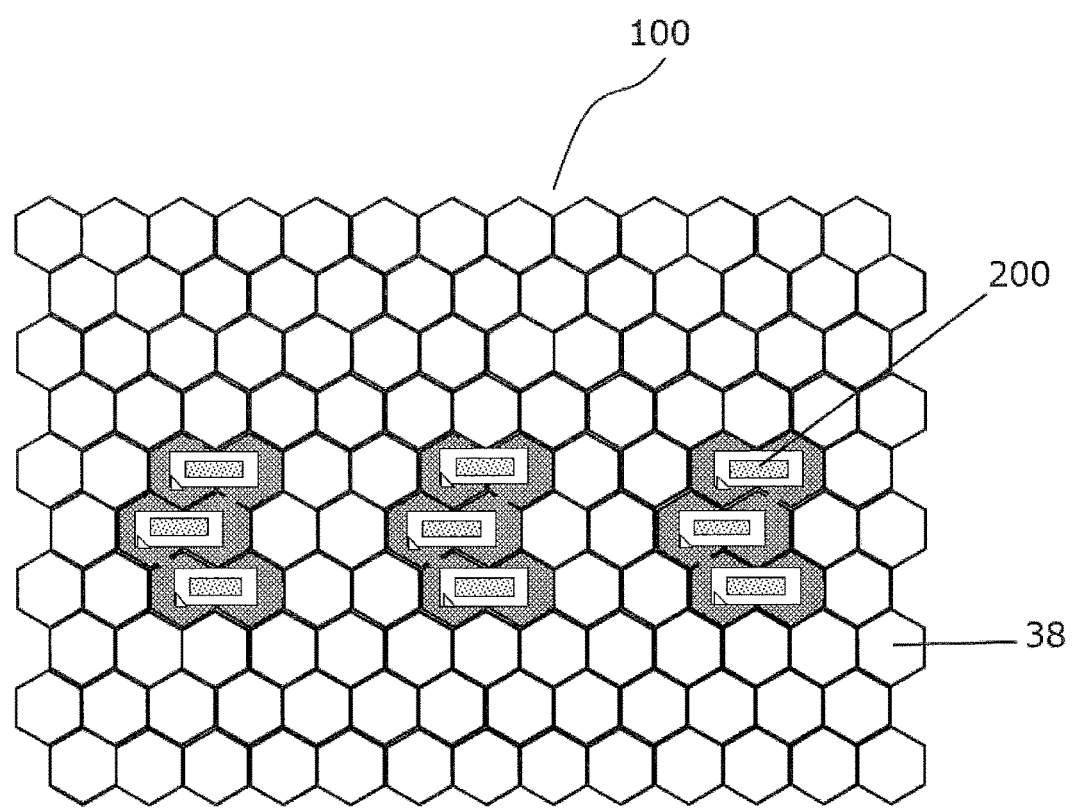
FIG. 10 is a schematic diagram of the wiring board according to the second embodiment of the present invention on which light emitting elements (LEDs) are mounted.

In mounting, for example, light emitting elements as the semiconductor elements according to the present embodiment, surface-mount type packaged light emitting diodes are mounted as the light emitting elements 200 as shown in FIG. 10. The cathode and anode on the back surface of each surface-mount type packaged light emitting diode are respectively electrically connected to adjacent metal films 18 (or the conductive members 17) insulated from each other by one partition 12.

The method according to the present embodiment may include cutting the wiring board. However, preferably a desired shape of the wiring board is attained in the providing insulating member, in view of reducing waste of members.

EXAMPLE 1

As the insulating member, a honeycomb core formed of an insulating resin film according to the method disclosed in Japanese Patent Publication 2014-87816 is provided. Specifically, the mountain fold lines and the valley fold lines along y direction which is perpendicular to x direction are alternately provided on an insulating transparent polyimide film having a thickness of 36 μm as shown in FIG. 2 in its feeding direction (i.e., x direction) in a cycle of 3.35 mm. Slits are provided at predetermined positions of the mountain fold lines and the valley fold lines. Holes are provided so as to be tangent to (or so as to intersect) predetermined positions of the mountain fold lines and the valley fold lines. Two mountain fold lines and two valley fold lines are alternately provided in a 3.2 mm cycle in parallel to x direction. In other words, the fold lines are repeatedly provided: the mountain fold lines at a 3.2 mm interval, the mountain fold lines at a 3.2 mm interval, the valley fold lines at a 3.2 mm interval, and the valley fold lines at a 3.2 mm interval. The repetitive two mountain fold lines and two valley fold lines are folded at 120°, and folded back at the mountain fold lines and the valley fold lines being perpendicular to x direction (folded at) 180°. Thus, the honeycomb structure shown in FIG. 1 is formed.

Bright tin-plated copper balls each having a diameter of 5.54 mm are inserted into a plurality of regions 14 partitioned by the partitions 12 having the honeycomb structure. The plating thickness of each of the bright tin-plated copper balls is 10 μm.

Figure 9:
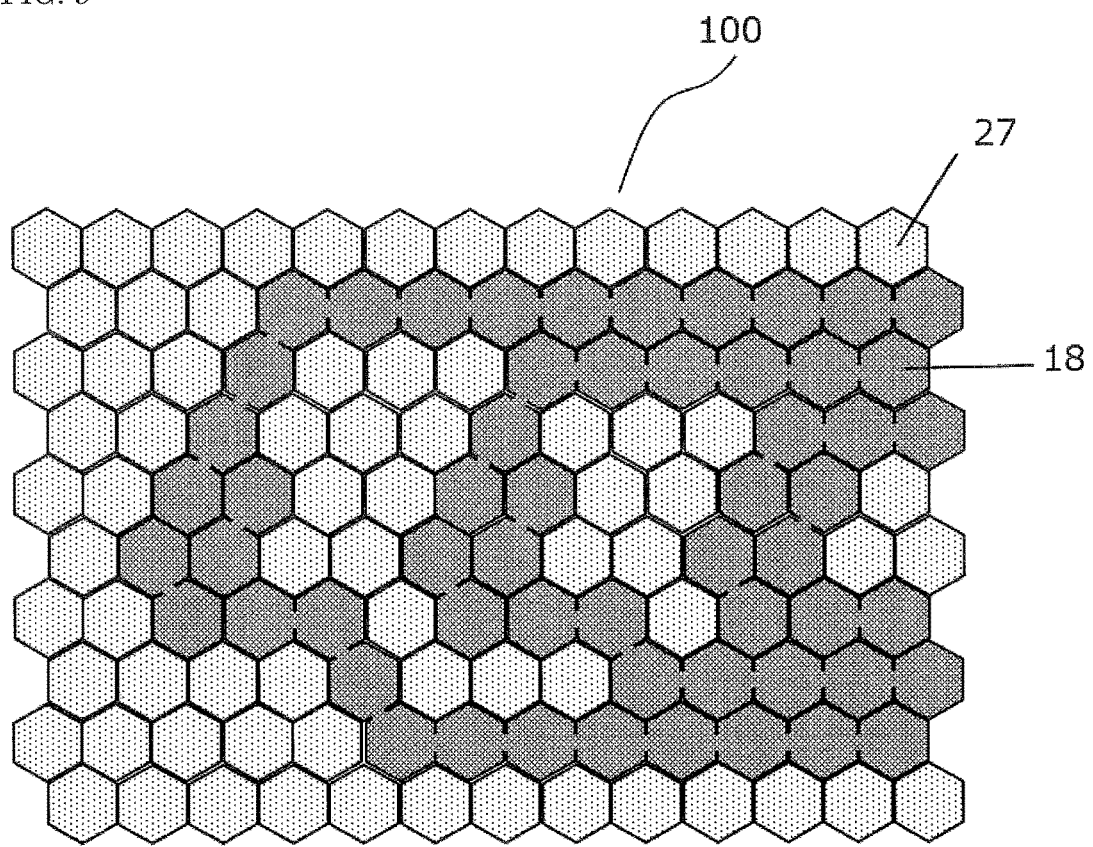
FIG. 9 is a schematic diagram of a wiring board according to a second embodiment of the present invention before a protective film is formed.

The copper balls are pressurized from above and/or below, to be deformed to each become a hexagonal column The honeycomb structure with the hexagonal columns is heated to about 235° C., so that the tin plating is fused by being melted at predetermined portions of the openings 16, and thereafter cooled. Thus, the wiring board 100 shown in FIG. 9 is obtained. The heating and fusing are preferably performed in a nitrogen atmosphere containing hydrogen by 1% to 4%, in order to improve the electrical conductivity of the fused portions.

Figure 11:
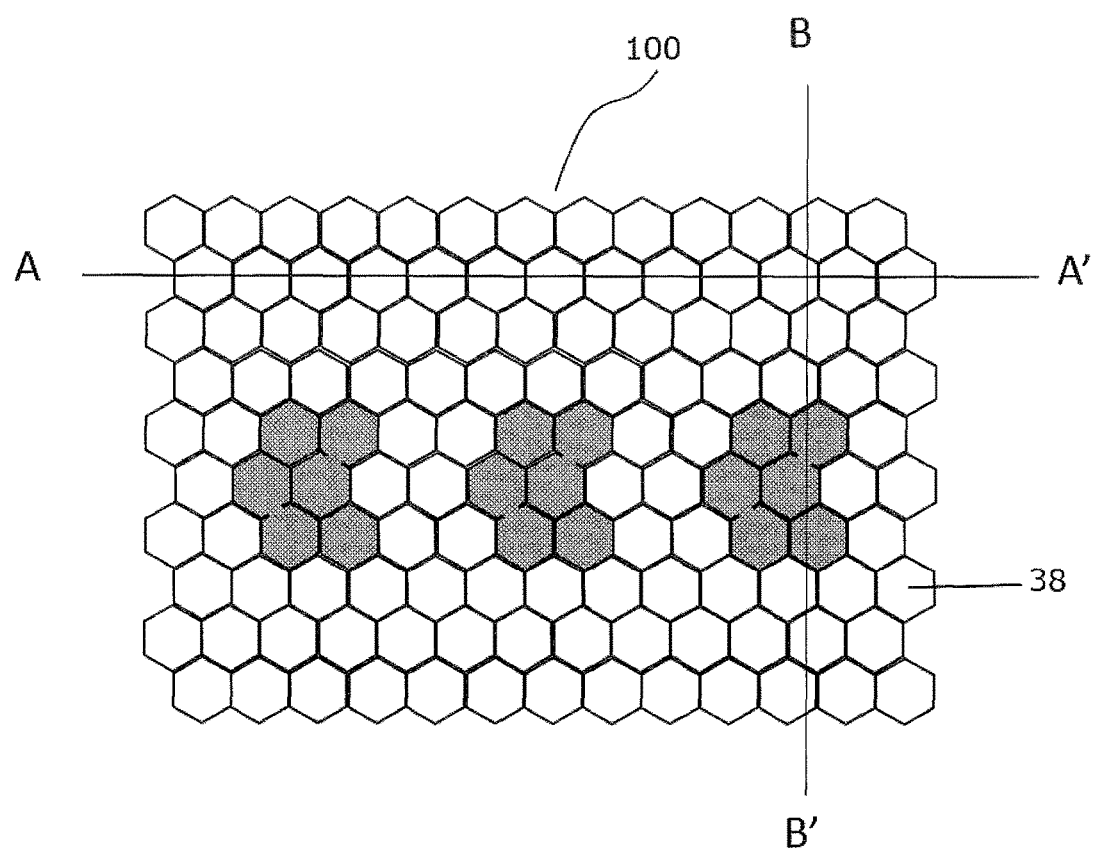
FIG. 11 is a top view of the wiring board according to the second embodiment of the present invention.
Figure 12:
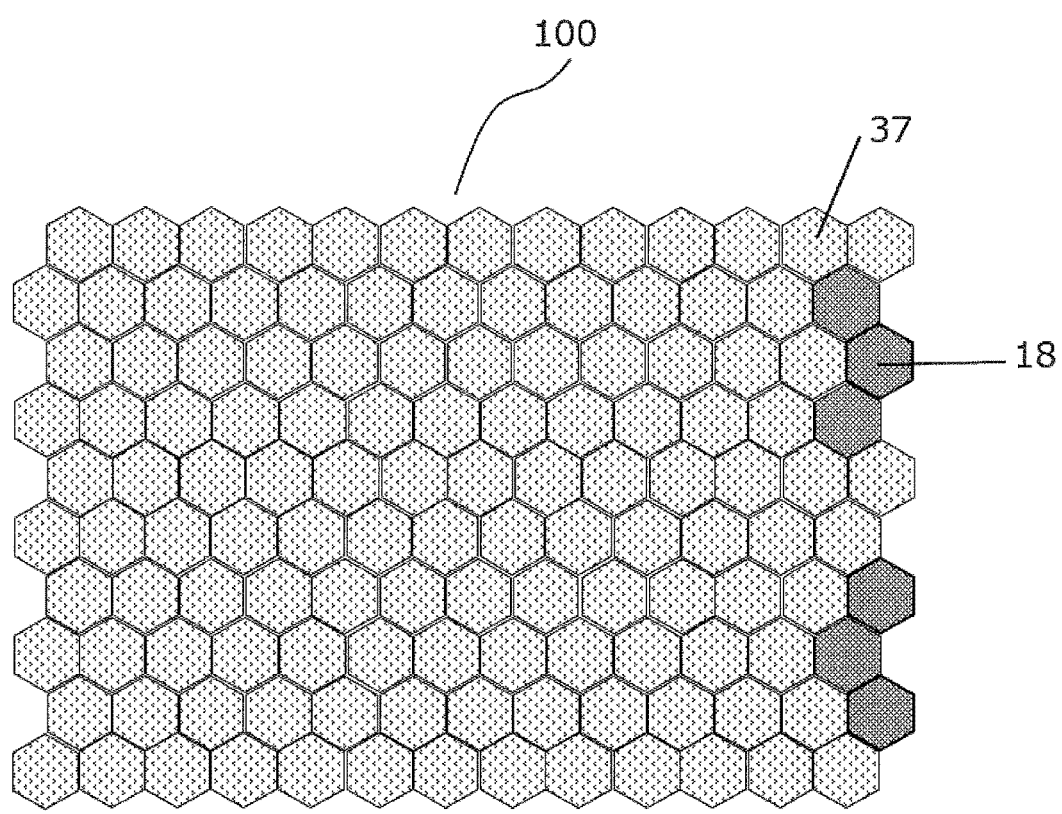
FIG. 12 is a bottom view of the wiring board according to the second embodiment of the present invention.
Figure 13A:
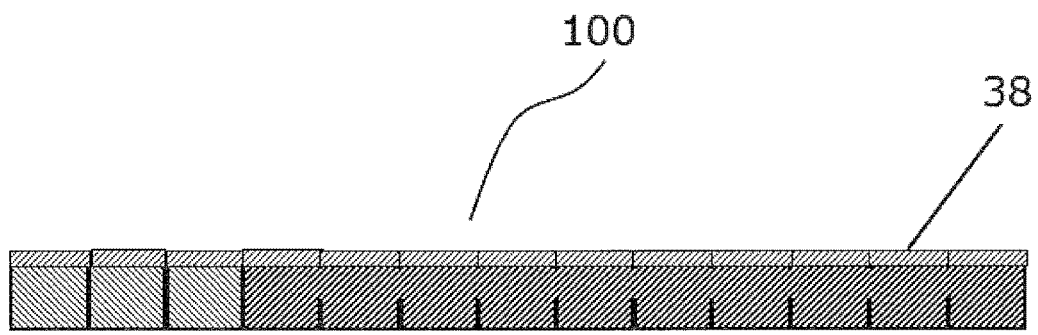
FIG. 13A is a cross-sectional view taken along line A-A' in FIG. 11.
Figure 13B:
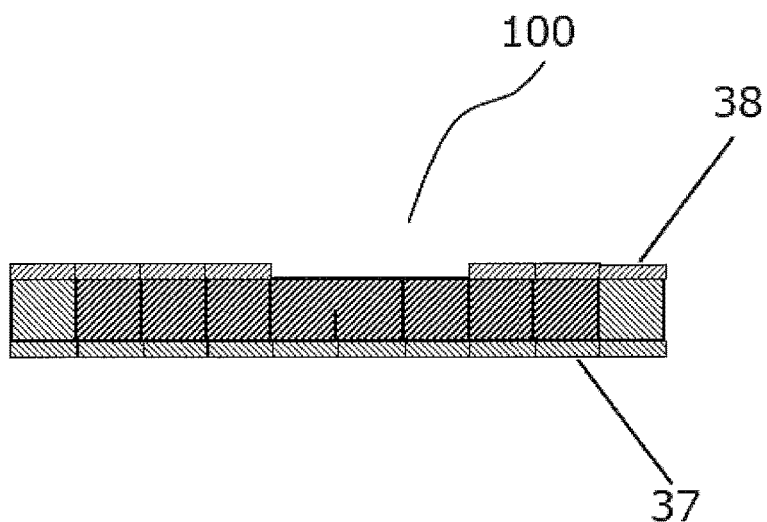
FIG. 13B is a cross-sectional view taken along line B-B' in FIG. 11.

As shown in FIG. 11, the insulating and light-reflective protective film 38 having openings at predetermined areas is formed on the upper surface of the wiring board 100. Further, as shown in FIG. 12, a polyimide film having a thickness of 18 μm is attached on the lower surface of the wiring board 100, thereby serving as the protective film 37.

The order of forming the protective film 38 having light reflectivity and the protective film 37 may be reversed, or they may be formed simultaneously.

In the wiring board formed in this manner, the hexagonal columnar metal pieces are fused at predetermined positions to form a wiring pattern. The insulating film is disposed around the metal pieces, so that the metal pieces are electrically insulated from each other. Applying the manner of Origami (the art of paper folding), the wiring board having a elongate shape can be fabricated.

EXAMPLE 2

As the insulating member, a honeycomb structure that has a bottom surface and formed of an insulating resin film is provided, which is disclosed in Japanese Patent Publication 2007-98930. Specifically, thermosetting resin coating or UV-curing resin coating is formed on a board in which recesses are arranged in checkerboard pattern so as to leave space while avoiding burying the recesses. The center-to-center distance D of the recesses is 0.5 mm, and the thickness of the insulating thermosetting resin coating is 0.154 mm.

Subsequently, the applied pressure is reduced around the board coated with the thermosetting resin. At the same time, the board coated with the thermosetting resin (both the board and the resin coating) is heated so as not to reach the thermosetting temperature in order to cause expansion of air in the recesses, thereby deforming the honeycomb material of the thermosetting resin coating. The dimensions after deformation are as follows: a height of 0.33 mm, a recess depth of 0.25 mm, a partition thickness of 0.08 mm. According to the method of the present example, the protective film that covers one side of the wiring board surface is previously fabricated in the providing the insulating member. Thus, the manufacturing steps are simplified.

Figure 14A:
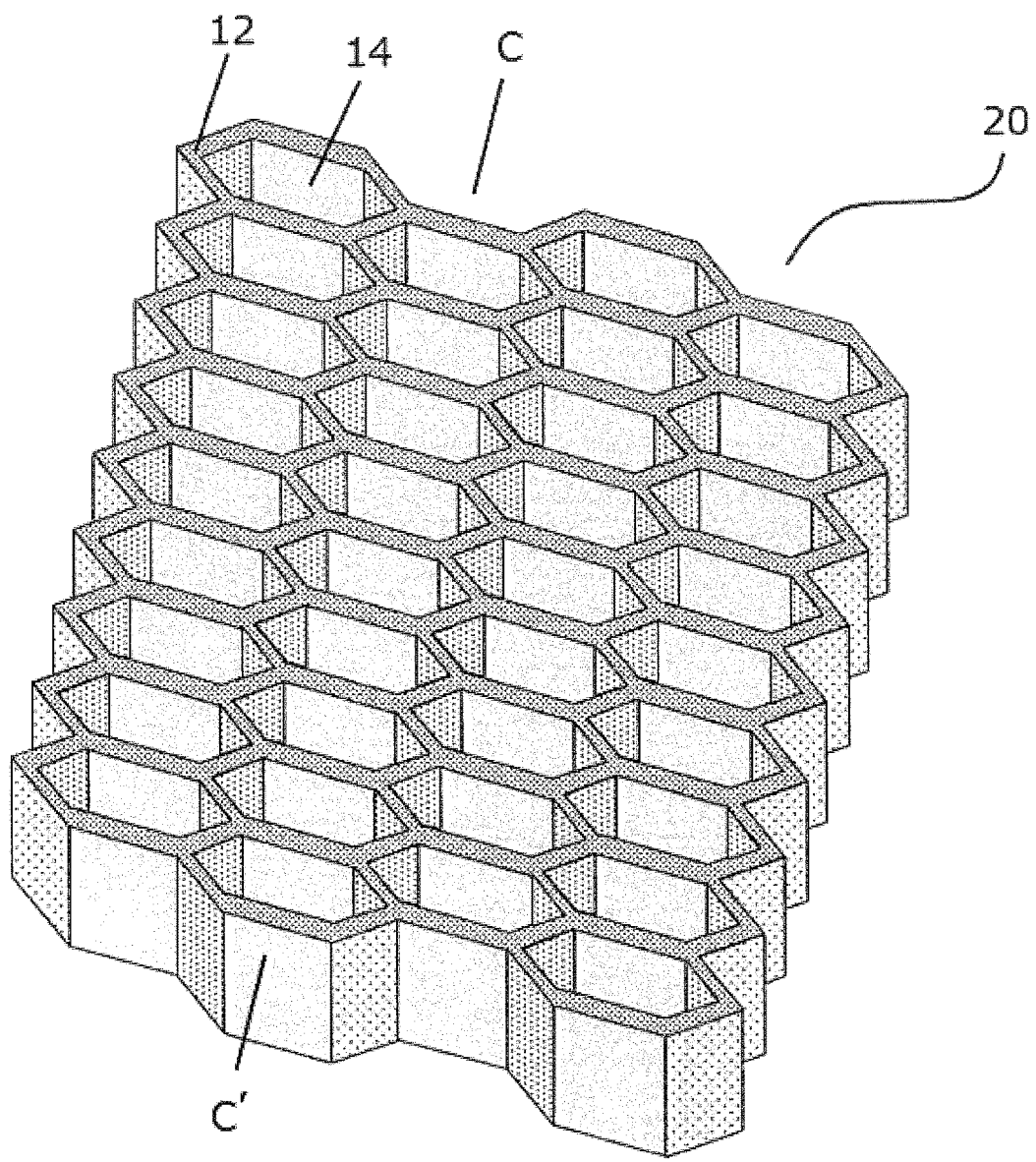
FIG. 14A is a schematic diagram of a bottomed honeycomb structure according to an example of the present invention.
Figure 14B:
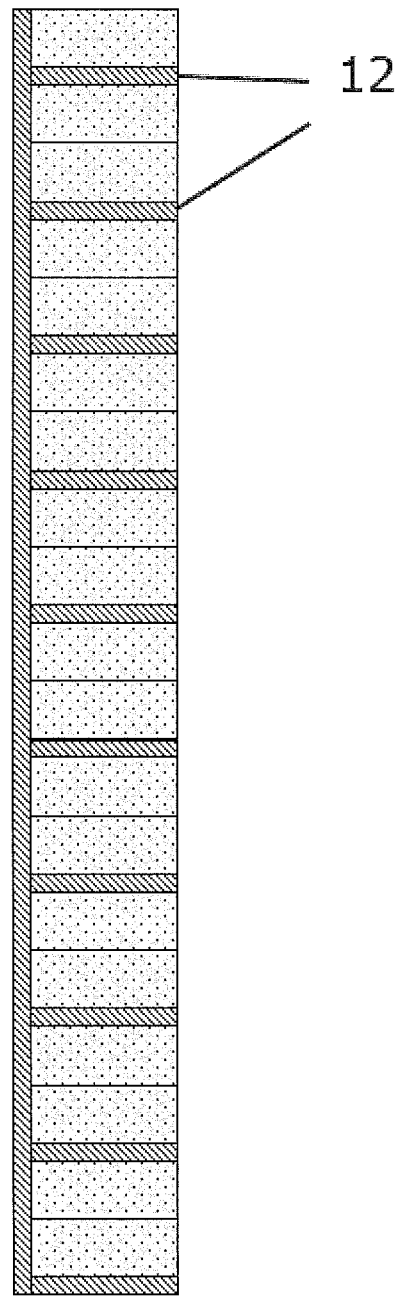
FIG. 14B is a cross-sectional view taken along line C-C' in FIG. 14A.

After being heated and cured (when UV-curing resin is used, irradiated with ultraviolet rays and cured), the board with the deformed resin coating is cooled. Then, the cured bottomed honeycomb structure is separated from the board (FIGS. 14A and 14B).

The honeycomb partitions are partially cut (by cutting work, e.g., end milling, or laser processing) at predetermined portions, to form openings. The openings each have a width of 0.2 mm and a height of 0.16 mm. In this manner, the insulating member is obtained which is partitioned into a plurality of regions by the partitions having openings.

Solder-plated copper-clad aluminum balls (each having a diameter of 0.41 mm) are respectively inserted into the regions partitioned by the partitions of the honeycomb structure. The balls are pressurized from above and/or below, to be deformed to each become a hexagonal column. The honeycomb structure with the hexagonal columns is heated, so that portions plated with solder are fused at predetermined portions, and thereafter cooled.

The protective coating film is formed on the upper surface. By the manufacturing method described above, the hexagonal columnar metal pieces are fused at predetermined positions to form a wiring pattern. The insulating resin film is disposed around the metal pieces, so that the metal pieces are electrically insulated from each other. Thus, the wiring board is formed.

While it has been described that the honeycomb structure with a bottom formed of an insulating resin film is the one disclosed in Japanese Patent Publication 2007-98930, the bottomed honeycomb structure may be fabricated using a 3D printer (additive manufacturing, fused deposition modeling (FDM)). Fabrication using a 3D printer can eliminate the step of partially removing the partitions at predetermined portions and reduces waste materials, and therefore is preferable.

Figure 15A:
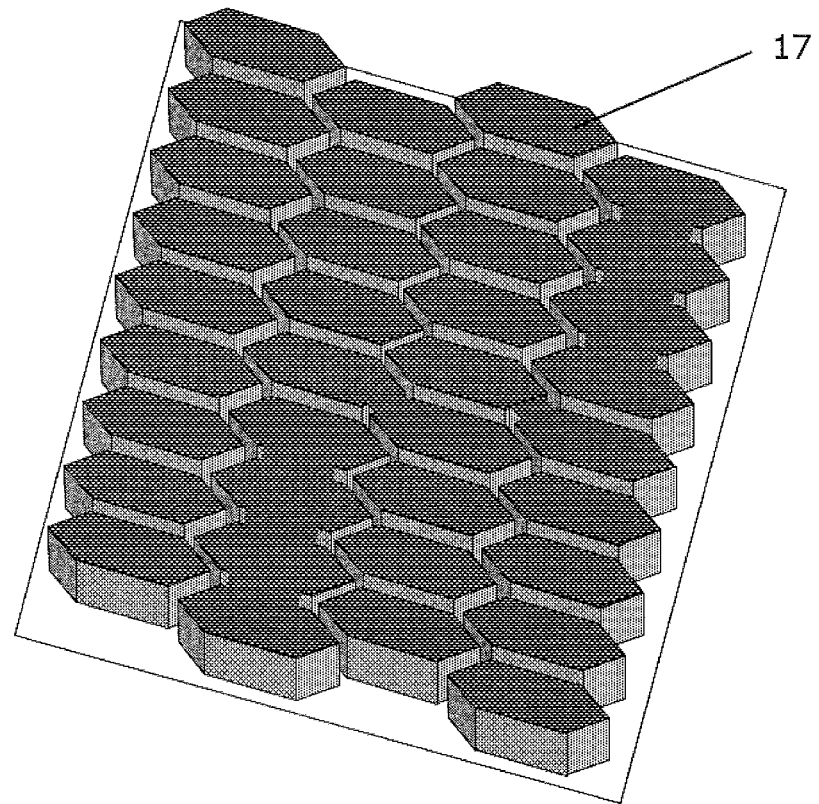
FIG. 15A is a diagram showing a method of manufacturing a wiring board according to a variation of the example of the present invention.
Figure 15B:
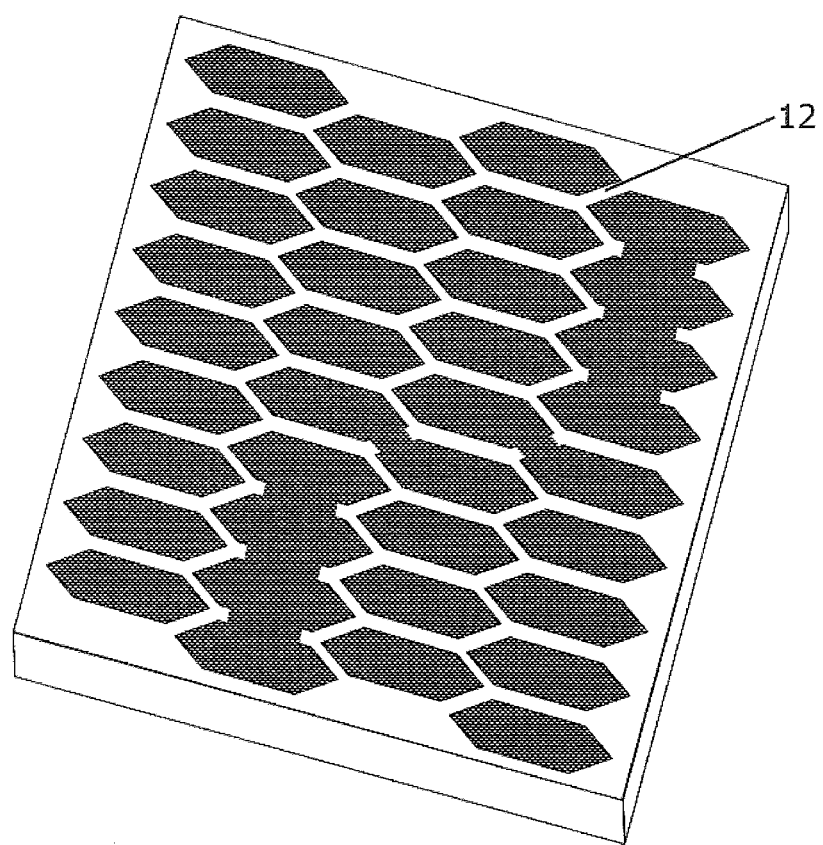
FIG. 15B is a diagram showing the wiring board according to the variation of the example of the present invention.

Further, as shown in FIG. 15A, it is also possible that metal thick films are formed from metal powder in predetermined shapes by laser coating on an insulating resin film, to serve as the conductive members 17. As shown in FIG. 15B, an insulating resin fills in the space (e.g., 100 μm) between the metal films, to serve as the partitions 12.

In the foregoing, the method of manufacturing a single-layer single-sided wiring board has been described. Whereas, a plurality of predetermined single-layer wiring boards may be bonded to each other. For example, the single-layer single-sided wiring boards may be bonded to each other respectively being oriented in opposite directions, to serve as a double-sided wiring board. Alternatively, the single-layer single-sided wiring boards may be bonded to each other both being oriented in the same direction, to serve as a multilayer wiring board including two or more layers.

The present disclosure is applicable to, for example, a wiring board used for LED lighting.

What is claimed is:

1. A method of manufacturing a wiring board comprising:
providing an insulating member that includes partitions surrounding a plurality of regions to define the plurality of regions, the plurality of regions including corners, the partitions including openings that pass through the partitions, the plurality of regions communicating with each other via the openings;
disposing conductive members in the plurality of regions; and
providing the conductive members in the openings to directly electrically connect the conductive members disposed in the plurality of regions to each other.

2. The method of manufacturing a wiring board according to claim 1,
wherein the joining includes thermally fusing the conductive members in a hydrogen-containing nitrogen atmosphere.

3. The method of manufacturing a wiring board according to claim 1 further comprising:
forming a protective film having insulation property on an upper surface and/or a lower surface of the wiring board such that each of the one or more conductive members is at least partially exposed.

4. A method of manufacturing a wiring board comprising:
providing an insulating member that includes partitions surrounding a plurality of regions to define the plurality of regions, the partitions including openings that pass through the partitions, the plurality of regions communicating with each other via the openings;
disposing conductive members in the plurality of regions; and
providing the conductive members in the openings to directly electrically connect the conductive members disposed in the plurality of regions to each other,
wherein the providing of the conductive members includes thermally fusing the conductive members in a hydrogen-containing nitrogen atmosphere.

5. A method of manufacturing a wiring board comprising:
providing an insulating member that includes partitions that surround a first region and a second region, the first region and the second region each including corners, the partitions including a partition wall provided between the first region and the second region, the partition wall having an opening that passes through the partition wall;
disposing a first conductive member in the first region and a second conductive member in the second region; and
joining the first conductive member to the second conductive member with electrically conductive material extending through the opening to electrically connect the first conductive member and the second conductive member to each other.

6. The method of manufacturing a wiring board according to claim 5,
wherein the joining includes thermally fusing the first conductive member and the second conductive member in a hydrogen-containing nitrogen atmosphere.

7. The method of manufacturing a wiring board according to claim 5 further comprising:
forming a protective film having insulation property on an upper surface and/or a lower surface of the wiring board such that each of the first conductive member and the second conductive member are at least partially exposed.

8. The method of manufacturing a wiring board according to claim 5 further comprising:
after the disposing, applying pressure to the first conductive member and the second conductive member from above and/or below, to bring the first conductive member and the second conductive member and the partitions into contact with each other.

* * * * *